United States Patent
Kong et al.

(10) Patent No.: US 10,036,102 B2
(45) Date of Patent: Jul. 31, 2018

(54) BISMUTH AND MAGNESIUM CO-DOPED LITHIUM NIOBATE CRYSTAL, PREPARATION METHOD THEREOF AND APPLICATION THEREOF

(71) Applicants: NANKAI UNIVERSITY, Tianjin (CN); TAISHAN SPORTS INDUSTRY GROUP CO., LTD., Leling, Shandong Province (CN)

(72) Inventors: Yongfa Kong, Tianjin (CN); Dahuai Zheng, Tianjin (CN); Shiguo Liu, Tianjin (CN); Jingjun Xu, Tianjin (CN); Peiming Xu, Leling (CN); Zhiyong Bian, Leling (CN); Shaolin Chen, Tianjin (CN); Ling Zhang, Tianjin (CN); Hongde Liu, Tianjin (CN)

(73) Assignees: NANKAI UNIVERSITY, Tianjin (CN); TAISHAN SPORTS INDUSTRY GROUP CO., LTD., Leling, Shandong (CN)

( * ) Notice: Subject to any disclaimer, the term of this patent is extended or adjusted under 35 U.S.C. 154(b) by 29 days.

(21) Appl. No.: 15/371,689

(22) Filed: Dec. 7, 2016

(65) Prior Publication Data
US 2017/0253994 A1 Sep. 7, 2017

(30) Foreign Application Priority Data
Mar. 1, 2016 (CN) .......................... 2016 1 0114580

(51) Int. Cl.
| | | |
|---|---|---|
| *G03H 1/02* | (2006.01) |
| *C30B 29/30* | (2006.01) |
| *C30B 15/10* | (2006.01) |
| *C30B 15/14* | (2006.01) |
| *C30B 15/30* | (2006.01) |
| *C04B 35/495* | (2006.01) |
| *C04B 35/626* | (2006.01) |
| *G02F 1/355* | (2006.01) |
| *G02F 1/00* | (2006.01) |

(52) U.S. Cl.
CPC ............ *C30B 29/30* (2013.01); *C04B 35/495* (2013.01); *C04B 35/6261* (2013.01); *C04B 35/62675* (2013.01); *C30B 15/10* (2013.01); *C30B 15/14* (2013.01); *C30B 15/30* (2013.01); *G02F 1/0018* (2013.01); *G02F 1/3551* (2013.01); *C04B 2235/3203* (2013.01); *C04B 2235/3206* (2013.01); *C04B 2235/3255* (2013.01); *C04B 2235/3298* (2013.01); *C04B 2235/604* (2013.01); *C04B 2235/656* (2013.01); *C04B 2235/9646* (2013.01); *G02F 2202/20* (2013.01)

(58) Field of Classification Search
USPC ........................................ 359/7, 3
See application file for complete search history.

(56) References Cited

U.S. PATENT DOCUMENTS

| | | |
|---|---|---|
| 3,346,344 A | 10/1967 | Levinstein |
| 3,446,603 A | 5/1969 | Loiacono |
| 6,906,835 B1 * | 6/2005 | Xu ........................... G03H 1/02 359/3 |

* cited by examiner

*Primary Examiner* — Monique Peets
(74) *Attorney, Agent, or Firm* — Andrew W. Chu; Craft Chu PLLC

(57) ABSTRACT

A bismuth and magnesium co-doped lithium niobate crystal includes $Li_2CO_3$, $Nb_2O_5$, $Bi_2O_3$ and MgO, wherein the molar ratio of [Li] and [Nb] is 0.90-1.00, the molar percentage of $Bi_2O_3$ in the mixture is 0.25-0.80%, and the molar percentage of MgO in the mixture is 3.0-7.0%. The bismuth and magnesium co-doped lithium niobate crystal has enhanced photorefraction, improved photorefractive sensitivity, shortened holographic grating saturation writing time, and the photorefractive diffraction efficiency can reach up to 17%. The response time is only 170 ms, when the holographic storage experiment is carried out using 488 nm continuous laser. Therefore, this crystal can be used in the field of holographic imaging.

2 Claims, 2 Drawing Sheets

BISMUTH AND MAGNESIUM CO-DOPED LITHIUM NIOBATE CRYSTAL, PREPARATION METHOD THEREOF AND APPLICATION THEREOF

CROSS-REFERENCE TO RELATED APPLICATIONS

See Application Data Sheet.

STATEMENT REGARDING FEDERALLY SPONSORED RESEARCH OR DEVELOPMENT

Not applicable.

THE NAMES OF PARTIES TO A JOINT RESEARCH AGREEMENT

Not applicable.

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not applicable.

STATEMENT REGARDING PRIOR DISCLOSURES BY THE INVENTOR OR A JOINT INVENTOR

Not applicable.

BACKGROUND OF THE INVENTION

1. Field of the Invention

The present invention relates to a technical field of nonlinear optical crystal, and particularly to one kind of bismuth and magnesium co-doped lithium niobate crystal, preparation thereof and application thereof.

2. Description of Related Art Including Information Disclosed Under 37 CFR 1.97 and 37 CFR 1.98

The lithium niobate ($LiNbO_3$) crystal is a multifunctional and multipurpose electro-optic material. The improvement of the photorefractive effect of crystal can promote the application of crystal in the fields of holographic storage and optical amplification and the like, and the increase of optical damage resistance threshold of crystal can promote the application of crystal in the fields of frequency conversion, Q-switch, parametric oscillation, and optical waveguide and the like. Ion doping can effectively change the nonlinear optical properties of lithium niobate crystal, generally speaking, the doping ions for lithium niobate crystal can be classified into two categories: one category is ions such as Fe, Cu, Mn, Ni, Mo and Ce, etc. which can enhance the photorefractive effect of lithium niobate crystal; the other category is ions such as Mg, Zn, Sc and In, etc. which can effectively increase the optical damage resistance ability of lithium niobate crystal. Exploring ion doping type of lithium niobate crystal with high photorefractive effect, high photorefractive sensitivity and high optical damage resistance ability will widely drive the practical application of lithium niobate crystal. There is no report of increasing both the photorefractive properties and the optical damage resistance properties of lithium niobate crystal at present due to the consistency of them as the traditional cognition.

BRIEF SUMMARY OF THE INVENTION

The technical problem to be solved in the present invention is to provide a bismuth and magnesium co-doped lithium niobate crystal which can improve the photorefractive sensitivity but also enhance the optical damage resistance ability of the crystal, which makes up the shortcomings of the existing technologies and materials.

The technical solutions of the present invention to solve the above technical problem are as follows:

A bismuth and magnesium co-doped lithium niobate crystal is provided in the present invention, consisting of $Li_2CO_3$, $Nb_2O_5$, $Bi_2O_3$ and MgO, wherein the molar ratio of [Li] and [Nb] is 0.90-1.00, the doping molar percentage of $Bi_2O_3$ is 0.25-0.80%, and the doping molar percentage of MgO in the mixture is 3.0-7.0% (the doping molar percentage means that the percent of matter amount of $Bi_2O_3$ or MgO to that of the whole mixture; i.e., the molar percentage of $Bi_2O_3$ in the mixture is 0.25-0.80%, and the molar percentage of MgO in the mixture is 3.0-7.0%).

Further, the purity of $Li_2CO_3$, $Nb_2O_5$, $Bi_2O$ and MgO is 99.99%.

The present invention also relates to a method for preparing the bismuth and magnesium co-doped lithium niobate crystal, comprises the following steps:

1) The powders of $Li_2CO_3$, $Nb_2O_5$, $Bi_2O_3$ and MgO are mixed in the ratio of materials to be used, then the mixture is mixed by grinding sufficiently with a planetary ball mill, after that it is kept at a constant temperature of 850° C. to decompose $Li_2CO_3$ sufficiently, calcined at 1150° C. to make the mixed materials take place full solid phase reaction, such that the powder of bismuth and magnesium co-doped lithium niobate can be obtained.

2) The powder of bismuth and magnesium co-doped lithium niobate prepared from the step 1) is compacted, put into a platinum crucible and heated with medium-frequency induction, then the bismuth and magnesium co-doped lithium niobate crystal is grown along the C-axis direction following the procedures of seeding, pulling neck, diameter enlarging, diameter equaling and ending by Czochralski method.

Further, the rotating speed of ball mill in the step 1) of the method for preparing the bismuth and magnesium co-doped lithium niobate crystal is 250-320 r/min, the grinding time is 2-3 hours. It is kept at 850° C. for 2-3 hours; and it is calcined at 1150° C. for 6-10 hours.

Further, it is characterized in that, the process parameters for growing the bismuth and magnesium co-doped lithium niobate crystal along the C-axis direction by Czochralski method in the step 2) of the method for preparing the bismuth and magnesium co-doped lithium niobate crystal are: pulling rate of 0.5-1 mm/h, rotating speed of 6-10 r/min, temperature gradient in the melt of 0.5-2.0° C./mm, and temperature gradient above the melt of 0.5-2.0° C./mm.

A bismuth and magnesium co-doped lithium niobate crystal for application in the laser frequency conversion, parametric oscillation, Q-switch, electro-optical modulation, holographic storage and holographic display.

The advantages and effects of the present invention: a bismuth and magnesium co-doped lithium niobate crystal of the present invention has advantages of enhanced photorefraction, improved photorefractive sensitivity, shortened holographic grating saturation writing time, and the photorefractive diffraction efficiency can reach up to 17% and the response time is only 170 ms when the holographic storage experiment is carried out using 488 nm continuous laser, and thus can be used in the field of holographic imaging.

Meanwhile, the optical damage resistance threshold of the bismuth and magnesium co-doped lithium niobate crystal can reach $10^6$ mw/cm$^2$, thus can be used in the fields of laser frequency conversion, parametric oscillation, Q-switch, electro-optical modulation, holographic storage and holographic display.

DETAILED DESCRIPTION OF THE INVENTION

The principles and features of the present invention will be described below in combination with the embodiments, the examples listed are only used to explain the present invention, but not to limit the scope of the present invention.

Embodiment 1

A bismuth and magnesium co-doped lithium niobate crystal, which is prepared by the following steps:

1) Li$_2$CO$_3$, Nb$_2$O$_5$, Bi$_2$O$_3$ and MgO with purity of 99.99% are weighed for formulating, wherein the molar ratio of [Li] and [Nb] is 0.90, the molar percentage of Bi$_2$O$_3$ in the mixture is 0.25%, the molar percentage of MgO in the mixture is 3.0%, the mixture is mixed by grinding sufficiently with a planetary ball mill at 250 r/min for 2 hours, then it is kept at a constant temperature of 850° C. for 2 hours to decompose Li$_2$CO$_3$ sufficiently, calcined at 1150° C. for 6 hours to make the mixed materials take place full solid phase reaction, such that the powder of bismuth and magnesium co-doped lithium niobate can be obtained;

2) The powder prepared from the step is compacted, put into a platinum crucible and heated with medium-frequency induction, then the bismuth and magnesium co-doped lithium niobate crystal is grown along the C-axis direction following the procedures of seeding, pulling neck, diameter enlarging, diameter equaling and ending by Czochralski method; process parameters are: pulling rate of 1.0 mm/h, rotating speed of 6 r/min, temperature gradient in the melt of 0.5-2.0° C./mm, and temperature gradient above the melt of 0.5-2.0° C./mm.

The crystal obtained by Czochralski method is annealed at 1190° C. for single domain, orientation, cutting and polishing process, to be made 3 mm and 1 mm-thickness plates and optical grade polished in the y-direction. The photorefractive experiment of lithium niobate crystal.

Figure 1:
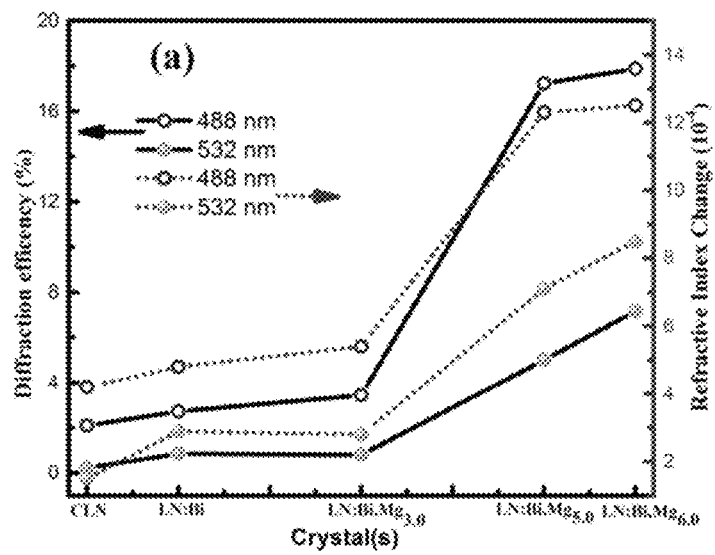
FIG. 1 is a schematic view of the diagram of change of the photorefractive diffraction efficiency of the lithium niobate crystals according to the present invention.
Figure 2:
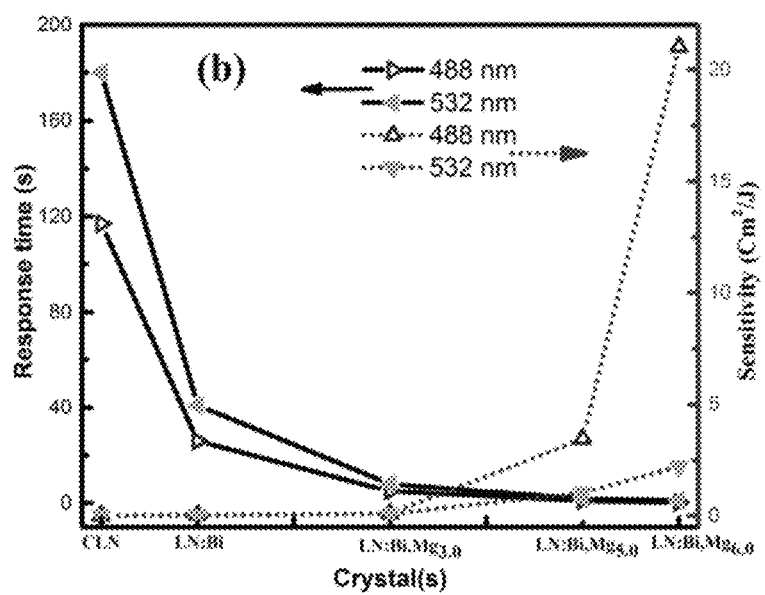
FIG. 2 is a schematic view of the diagram of change of the photorefractive response time of the lithium niobate crystals according to the present invention.
Figure 3:
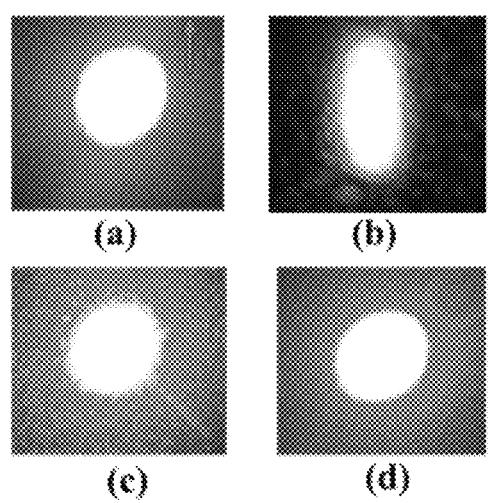
FIG. 3 is a schematic view of the diagram of the optical damage resistance experiment of the lithium niobate crystals according to the present invention: wherein, the legend (a) shows the original spot as control, the light intensity in the legends (a), (c) and (d) is $5.8 \times 10^6$ mw/cm$^2$; the light intensity in the legend (b) is $7.8 \times 10^2$ mw/cm$^2$.

Employ the continuous laser of 532 nm or 488 nm at 400 mw/cm$^2$ to carry out the photorefractive experiment of lithium niobate crystal, the test results (as shown in FIG. 1 and FIG. 2) indicated that: the holographic diffraction efficiencies are 0.87% and 3.45%, respectively. The photorefractive response times are 8 s and 5 s, respectively; and the photorefractive sensitivities are 0.094 cm$^2$/J and 0.097 cm$^2$/J, respectively. Compared to the congruent lithium niobate (CLN) crystal, the crystal of the present invention had advantages of enhanced photorefraction, shortened response time, and improved sensitivity. Meanwhile, the spot distortion method is used to carry out the optical damage resistance ability test of lithium niobate crystal, the results (as shown in FIG. 3 (b) indicated that: the optical damage resistance threshold of the crystal is $7.8 \times 10^2$ W/cm$^2$.

Embodiment 2

A bismuth and magnesium co-doped lithium niobate crystal, which is prepared by the following steps:

1) Li$_2$CO$_3$, Nb$_2$O$_5$, Bi$_2$O$_3$ and MgO with purity of 99.99% are weighed for formulating, wherein the molar ratio of [Li] and [Nb] is 0.94, the molar percentage of Bi$_2$O$_3$ in the mixture is 0.5%, and the molar percentage of MgO in the mixture is 5.0%, the mixture is mixed by grinding sufficiently with a planetary ball mill at 320 r/min for 3 hours, then it is kept at 850° C. for 3 hours to decompose Li$_2$CO$_3$ sufficiently, calcined at 1150° C. for 10 hours to make the mixed materials take place full solid phase reaction, such that the powder of bismuth and magnesium co-doped lithium niobate can be obtained.

2) The powder of the bismuth and magnesium co-doped lithium niobate prepared from the step 1) is compacted, put into a platinum crucible and heated with medium-frequency induction, then the bismuth and magnesium co-doped lithium niobate crystal is grown along the C-axis direction following the procedures of seeding, pulling neck, diameter enlarging, diameter equaling and ending by Czochralski method. Process parameters are: pulling rate of 1.0 mm/h, rotating speed of 8 r/min, temperature gradient in the melt of 0.5-2.0° C./mm, and temperature gradient above the melt of 0.5-2.0° C./mm.

3) The bismuth and magnesium co-doped lithium niobate crystal obtained from the step 2) is annealed at 1190° C. for single domain, orientation, cutting and polishing process, to be made into 3 mm and 1 mm-thickness plates and optical grade polished in the y-direction. The photorefractive experiment of lithium niobate crystal is carried out with continuous laser of 532 nm or 488 nm at 400 mw/cm$^2$, the test results (as shown in FIG. 1 and FIG. 2) indicated that: the holographic diffraction efficiencies are 5.01% and 17.24%, respectively; the response times are 1.8 s and 1 s, respectively; and the photorefractive sensitivities are 1.04 cm$^2$/J and 3.46 cm$^2$/J, respectively. Compared to the iron-doped lithium niobate crystal, the photorefractive response time of the crystal of the present invention is shortened by one order of magnitude, and the photorefractive sensitivity is improved by two orders of magnitude. The results of the optical damage resistance ability test (as shown in FIG. 3 (c)) indicated that: the optical damage resistance threshold of the crystal is $5.8 \times 10^6$ W/cm$^2$, thus this crystal can be used for application in the field of high light intensity and density of holographic storage.

Embodiment 3

A bismuth and magnesium co-doped lithium niobate crystal, which is prepared by the following steps:

1) Li$_2$CO$_3$, Nb$_2$O$_5$, Bi$_2$O$_3$ and MgO with purity of 99.99% are weighed for formulating, wherein the molar ratio of [Li] and [Nb] is 1.00, the molar percentage of Bi$_2$O$_3$ in the mixture is 0.5%, the molar percentage of MgO in the mixture is 6.0%, the mixture is mixed by grinding sufficiently with a planetary ball mill at 320 r/min for 3 hours, then it is kept at a constant temperature of 850° C. for 3 hours to decompose $Li_2CO_3$ sufficiently, calcined at 1150° C. for 10 hours to make the mixed materials take place full solid phase reaction, such that the powder of bismuth and magnesium co-doped lithium niobate can be obtained;

2) The powder of the bismuth and magnesium co-doped lithium niobate prepared from the step 1) is compacted, put into a platinum crucible and heated with medium-frequency induction, then the bismuth and magnesium co-doped lithium niobate crystal is grown along the C-axis direction following the procedures of seeding, pulling neck, diameter enlarging, diameter equaling and ending by Czochralski method; process parameters are: pulling rate of 0.5 mm/h, rotating speed of 10 r/min, temperature gradient in the melt of 0.5-2.0° C./mm, and temperature gradient above the melt of 0.5-2.0° C./mm.

The crystal obtained from the step 2) by Czochralski method is annealed at 1190° C. for single domain, orientation, cutting and polishing process, to be made into 3 mm and 1 mm-thickness optical grade polished plates in the y-direction. The photorefractive experiment of the bismuth and magnesium co-doped lithium niobate is carried out under the same experimental conditions as Embodiment 1, the test results (as shown in FIG. 1 and FIG. 2) indicated that: the photorefractive diffraction efficiencies are 7.15% and 17.89%, respectively; the photorefractive response times are 1 s and 170 ms, respectively; and the photorefractive sensitivities are 2.23 $cm^2$/J and 21 $cm^2$/J, respectively. The photorefractive response time at 488 nm can be shortened to 0.17 s. The results of optical damage resistance ability test (as shown in FIG. 3(d)) indicated that: the optical damage resistance threshold of the crystal is: $10^6$ W/$cm^2$, thus the crystal can be used in the fields of laser frequency conversion, parametric oscillation, Q-switch, electro-optical modulation, holographic storage or holographic display.

Embodiment 4

An application of the bismuth and magnesium co-doped lithium niobate crystal, includes the application of the bismuth and magnesium co-doped lithium niobate crystal in the laser frequency conversion, parametric oscillation, Q-switch, electro-optical modulation, holographic storage and holographic display.

The Embodiments described above are only preferred embodiments of the present invention, but not the limitations of the present invention. All the modifications, equivalents, substitutions and improvements etc. made within the spirit and principle of the present invention should fall within the protection scope of the present invention.

We claim:

1. A bismuth and magnesium co-doped lithium niobate crystal, comprising:
    a mixture of $Li_2CO_3$, $Nb_2O_5$, $Bi_2O_3$ and MgO, wherein molar ratio of [Li] and [Nb] is 0.90-1.00, wherein molar percentage of $Bi_2O_3$ in the mixture is 0.25-0.80%, and wherein molar percentage of MgO in the mixture is 3.0-7.0%.

2. A The bismuth and magnesium co-doped lithium niobate crystal, according to claim 1, wherein purity of $Li_2CO_3$, $Nb_2O_5$, $Bi_2O$ and MgO is 99.99%.

* * * * *